(12) United States Patent
Saitoh

(10) Patent No.: US 6,392,881 B1
(45) Date of Patent: May 21, 2002

(54) PORTABLE ELECTRONIC DEVICE

(75) Inventor: Asao Saitoh, Saitama (JP)

(73) Assignee: Citizen Watch Co., Ltd., Tokyo (JP)

(*) Notice: Subject to any disclaimer, the term of this patent is extended or adjusted under 35 U.S.C. 154(b) by 0 days.

(21) Appl. No.: 09/308,615

(22) PCT Filed: Sep. 22, 1998

(86) PCT No.: PCT/JP98/04270

§ 371 Date: May 20, 1999

§ 102(e) Date: May 20, 1999

(87) PCT Pub. No.: WO99/16020

PCT Pub. Date: Apr. 1, 1999

(30) Foreign Application Priority Data

Sep. 22, 1997 (JP) .............................................. 9-256504

(51) Int. Cl.⁷ ................................................. H05K 7/20
(52) U.S. Cl. ........................ 361/686; 361/737; 361/752; 361/683; 206/328; 345/205
(58) Field of Search ................................ 361/737, 801, 361/681, 686, 683, 684–687, 752, 759, 796–798, 716, 721; 312/223.1, 223.2, 223.3; 429/100, 153, 176, 177; 345/205–206; 359/54, 83, 87–88, 98; 708/100; 348/560, 634; 206/521, 523, 541, 328, 449, 39, 339; 364/708.1; 439/76, 77, 152–153

(56) References Cited

U.S. PATENT DOCUMENTS

| | | | | |
|---|---|---|---|---|
| 4,862,153 A | * | 8/1989 | Nakatani et al. ............. | 340/719 |
| 5,442,470 A | * | 8/1995 | Hashimoto .................... | 359/83 |
| 5,548,483 A | * | 8/1996 | Feldman ..................... | 361/737 |
| 5,673,180 A | * | 9/1997 | Pernet ......................... | 361/756 |
| 5,751,558 A | * | 5/1998 | Gullicksrud et al. ........ | 361/801 |
| 5,777,610 A | * | 7/1998 | Sugimoto et al. ........... | 345/206 |
| 5,936,600 A | * | 8/1999 | Ohashi et al. ................ | 345/87 |
| 6,049,813 A | * | 4/2000 | Danielson et al. .......... | 708/100 |

FOREIGN PATENT DOCUMENTS

| | | | | | |
|---|---|---|---|---|---|
| JP | 355023483 A | * | 2/1980 | ............ | G04G/1/00 |
| JP | 63-12051 | | 1/1988 | | |
| JP | 363237115 A | * | 10/1988 | ............. | G06F/1/00 |
| JP | 1-165494 | | 6/1989 | | |
| JP | 402176848 A | * | 7/1990 | ........... | G06F/15/02 |
| JP | 2-116367 | | 9/1990 | | |
| JP | 3-124397 | | 12/1991 | | |
| JP | 4-23082 | | 1/1992 | | |
| JP | 4-87273 | | 7/1992 | | |
| JP | 6-90420 | | 3/1994 | | |
| JP | 6-258623 | | 9/1994 | | |
| JP | 6-79577 | | 11/1994 | | |
| JP | 409006729 A | * | 1/1997 | ........... | G06F/15/02 |
| JP | 9-109579 | | 4/1997 | | |
| JP | 409153018 A | * | 6/1997 | ........... | G06F/15/02 |

OTHER PUBLICATIONS

IBM Technical Disclosure Bulletin, Sep., 1992, vol. 35, issue 4A, pp. 41–43.*
Partial translation of JP 4–87273.
Partial translation of JP 3–124397.
Partial translation of JP 2–116367.
Partial translation of JP 6–79577.

* cited by examiner

Primary Examiner—Leo P. Picard
Assistant Examiner—Michael Datskovsky
(74) Attorney, Agent, or Firm—Smith, Gambrell & Russell, LLP

(57) ABSTRACT

A liquid crystal cell (3), a circuit substrate (12) and a battery holder (10) are housed in a case body composed of an upper cover (8a) having a display window, a lower cover (8b) and a frame (9). A connector including a large number of signal terminals is connected to one end of the circuit substrate (12), and the circuit substrate is arranged on the liquid crystal cell (3) one above the other within the case body. The battery holder (10) is arranged in parallel to the circuit substrate (12).

30 Claims, 16 Drawing Sheets

PORTABLE ELECTRONIC DEVICE

TECHNICAL FIELD

This invention relates to a portable electronic equipment which has an information storage function inside a body thereof and may be connected to an external terminal equipment such as a personal computer to enable display of required information on a display screen of the body.

BACKGROUND ART

Recently, a portable electronic equipment having a circuit substrate, a connector and a liquid crystal cell or the like has been in use in large numbers. In Japanese Utility Model Application Laid-open No. 63-72651, for instance, there is disclosed the technique of a portable electronic equipment in the prior art. A description will be given of its outline with reference to FIGS. 15 and 16 in the following.

In a portable electronic equipment 100, a connector 102 connected to an external data input device 101 such as a personal computer is mounted on the side of a case 106. Also, a display section 107 and an operating section 110 composed of index, page and mode or like operation keys 108 and cursor operation keys 109 are provided on the surface of the case 106.

Further, a storage section composed of a central processing unit (CPU) 103, a random access memory (RAM) 104 and a read-only memory (ROM) 105 or the like and a display device such as a liquid crystal cell are incorporated in the case 106.

Upon receipt of desired data from the external data input device 101 by connecting the external data input device 101 to the connector 102 of the portable electronic equipment 100, this data is stored in the storage section through an input/output control section 111. The data stored in the storage section is processed on the basis of an operating signal from the operating section 110 and is then displayed on the display section 107 through the input/output control section 111.

However, this portable electronic equipment 100 is larger in size than a credit card and does not meet the requirements of "a PC card" of PCMCIA (Personal Computer Memory Card International Association) standard type.

In this connection, a telephone directory electronic calculator card has been developed as a PC card of standard PCMCIA type and was patented on Oct. 15, 1996 in U.S.A. (Design Patent No. 374,661). This PC card 200 has an external appearance as shown in FIG. 17 and is combined with a personal computer having a PC card slot to enable reception of data from the personal computer.

The PC card 200 shown in FIG. 17 has already come into the market from IBM Co., Inc. by the trade name of "Chip Card". This PC card is mounted with a display 202 and a keyboard 203 on a body 201 within its limited surface space of a credit card size and also with a connector of PCMCIA type (not shown) and a CPU or the like serving as an operating function of a personal computer on the inside of the body 201 and uses two button batteries. In addition, this PC card is also mounted with a charging back-up battery capable of protecting data even in exchange of a battery for operation.

However, this PC card is mounted with the display and the keyboard or the like within the limited surface space of the credit card size as described above. Incidentally, although the keyboard having a plurality of keys embedded in the surface of the body is convenient in key inputting in case of retrieval in the outdoors or data inputting at a minimum in the place where a user has gone out, the area of the keyboard amounts to a large percentage in the limited area of the body, and the display is accordingly restricted to a narrow area, resulting in an occurrence of a problem that an information content visible at a time is reduced in the extreme.

Further, in Japanese Patent Application Laid-open No. 8-58275, there is disclosed a portable electronic equipment as a different instance of the portable electronic equipment having a circuit substrate, a connector and a liquid crystal cell or the like.

A description will now be given of this portable electronic equipment 100 with reference to a fragmentary sectional view of FIG. 18.

The portable electronic equipment 100 includes a circuit substrate 101 and electric components 102 such as IC chips mounted on the circuit substrate 101. The circuit substrate 101 and the electric components 102 are arranged between upper and lower outer metal plates 107 and are sealed up with a seal layer 103.

This seal layer 103 has a plurality of (for instance, four) through holes 104 extending from the front and back surfaces to the circuit substrate 101. A ground electrode 105 is arranged on the circuit substrate 101 at a position corresponding to the through hole 104. Thus, the ground electrode 105 is communicated with the outside through this through hole 104 when the upper outer metal plate 107 is removed.

A coil type metal spring 106 is inserted into each through hole 104 provided in the seal layer 103. When the outer metal plate 107 is stuck on both of the front surface (the upper surface) and the back surface (the lower surface) of the seal layer 103, the metal spring 106 in each through hole 104 is contracted, and one end of each metal spring 106 presses the inside surface of the outer metal plate 107. As a result, the circuit substrate 101 and the outer metal plates 107 are electrically connected together through the metal springs 106, and the outer metal plates 107 are thus grounded. An electric charge is discharged from the circuit substrate 101 through the metal springs 106.

On the other hand, a connector 109 is connected to one end of the circuit substrate 101 through a pair of metal pieces 108. These metal pieces 108 are sealed up with the seal layer 103. The thickness of the connector 109 is set to be equal to the thickness of the seal layer 103.

According to the portable electronic equipment 100 shown in FIG. 18, since four through holes are provided in the seal layer for mounting the metal springs electrically connected to the ground terminals of the circuit substrate, and four metal springs are required, there is a need for more working steps, more part cost and more incorporating steps or the like, resulting in an increase in cost.

DISCLOSURE OF THE INVENTION

It is an object of the present invention to provide a portable electronic equipment, which is based on PCMCIA standard and enables display of more information content on one image screen by enlarging an area of a display within a limited space of a credit card size.

For attaining the above object, a portable electronic equipment according to the present invention comprises a case body composed of an upper cover having a display window, a lower cover and a frame arranged along the peripheral edges of the upper and lower covers facing each other to define an inside space, and inside components including a liquid crystal cell, a circuit substrate and a battery holder and housed in the inside space of the case body, wherein the liquid crystal cell is arranged at a position corresponding to the display window of the upper cover of the case body, the circuit substrate is bonded to a connector including a large number of signal terminals capable of being connected to a connector provided on an external equipment and is arranged on the liquid crystal cell one above the other in the case body, and the battery holder is arranged on one end of the circuit substrate.

According to the present invention, a large integrated circuit is mounted in the limited space to enable expansion of a processing function, and it is possible to increase a ratio of the area of a display to the surface area of the equipment body.

BEST MODE FOR CARRYING OUT THE INVENTION

A portable electronic equipment 1 according to the present invention relates to an equipment of a credit card size based on "PC Card Standard" determined by PCMCIA.

This portable electronic equipment 1 has a size based on a type II of "PC Card Standard", for instance, and comprises a thin rectangular card-shaped body having a thickness T of 5 mm, a length L of 85.6 mm and a width W of 54 mm.

Figure 1:
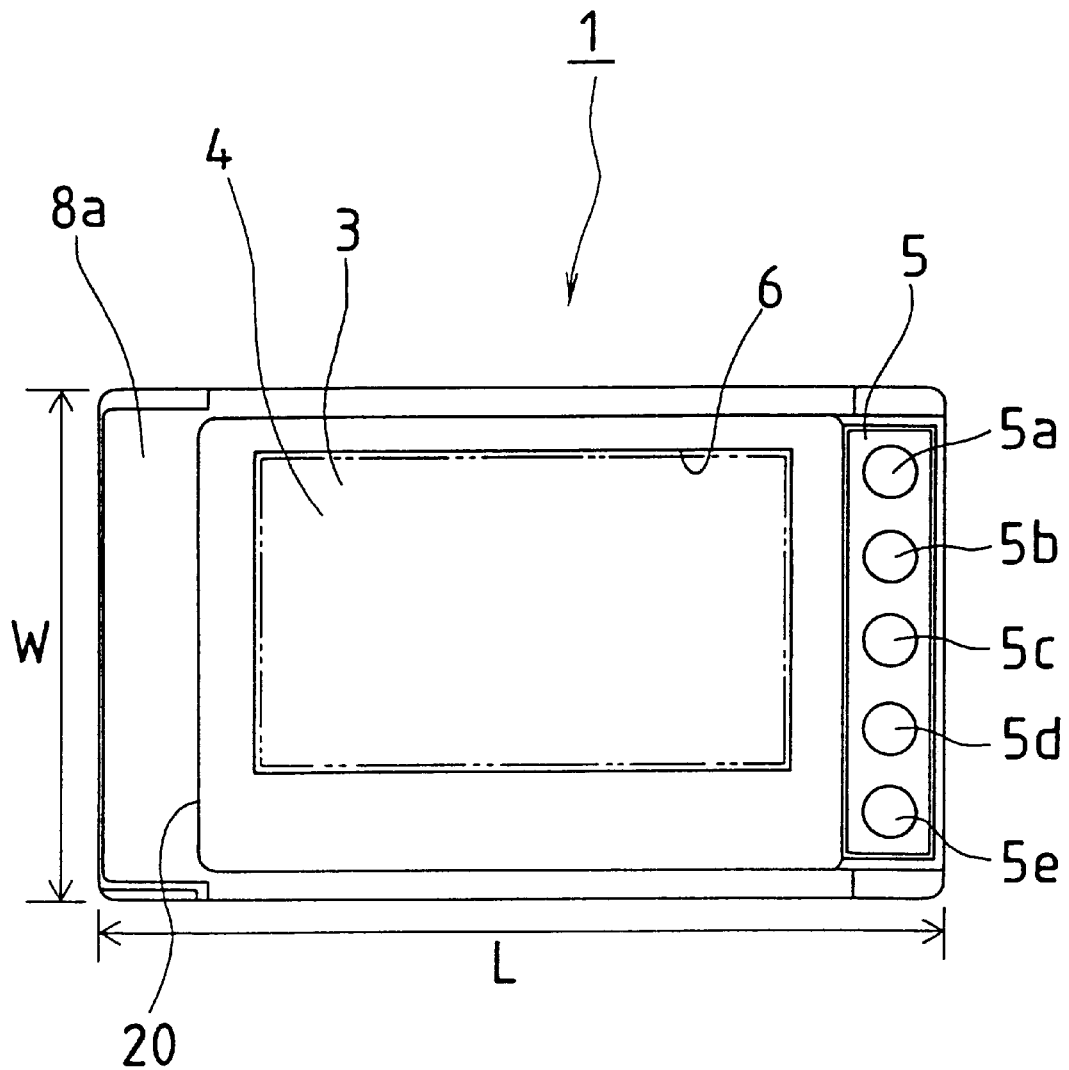
FIG. 1 is a stop view showing a portable electronic equipment according to one embodiment of the present invention.

As shown in FIG. 1, a rectangular display section 4 is provided in the center of the front surface of the portable electronic equipment 1. This display section 4 is equivalent to a liquid crystal cell 3 formed by a liquid crystal display element. In a right peripheral portion of the surface of the portable electronic equipment 1 as seen from FIG. 1, a plurality of, for instance, five operation input keys 5a, 5b, 5c, 5d and 5e are arranged in a row at predetermined intervals in a direction parallel to the right edge of the portable electronic equipment 1. These five keys 5a to 5e form an operating member 5.

Among the keys of the operating member 5, the key 5a is assigned for page return, the key 5b is for page turning, the key 5c is for input and keys 5d and 5e are for cursor shift, for instance.

The portable electronic equipment 1 including the display section 4 and various operation input keys 5a to 5e is applied in various modes such as a schedule table, a calendar and a directory.

Figure 3:
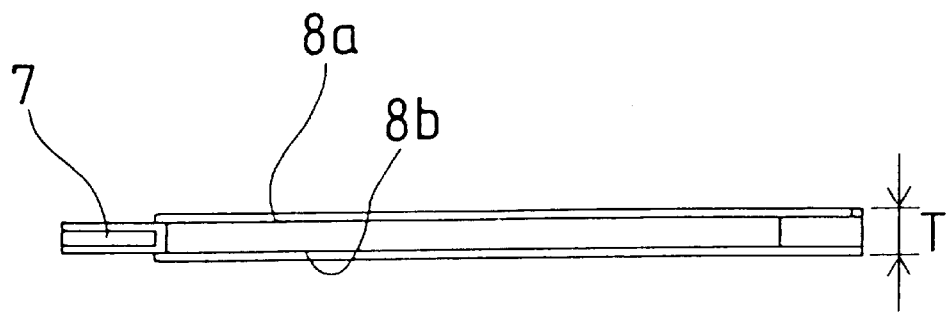
FIG. 3 is a view of the portable electronic equipment of FIG. 1 as seen from the side.

On the left edge of the portable electronic equipment 1, a connector 7 based on the standard of PCMCIA is connected to a circuit substrate which will be described later, as shown in FIG. 3. The connector 7 is provided with a large number of signal terminals and an external power supply terminal, which are capable of being connected to a connector provided on an external equipment (not shown) such as a personal computer, in parallel. The connector 7 of the portable electronic equipment 1 is connected to the connector of the personal computer to enable storage of data from the personal computer into the portable electronic equipment 1 of FIG. 1.

The front surface of the portable electronic equipment 1, that is, the surface provided with the display section, is formed by a metallic upper cover 8a having a thickness of 0.15 mm, and the back surface thereof is formed by a metallic lower cover 8b (see FIG. 2) having a thickness of 0.15 mm.

As shown in FIG. 1, the upper cover 8a has a stepped portion 20 in its peripheral portion for positioning the liquid crystal cell 3 and also has a display window 6 in the center.

Figure 2:
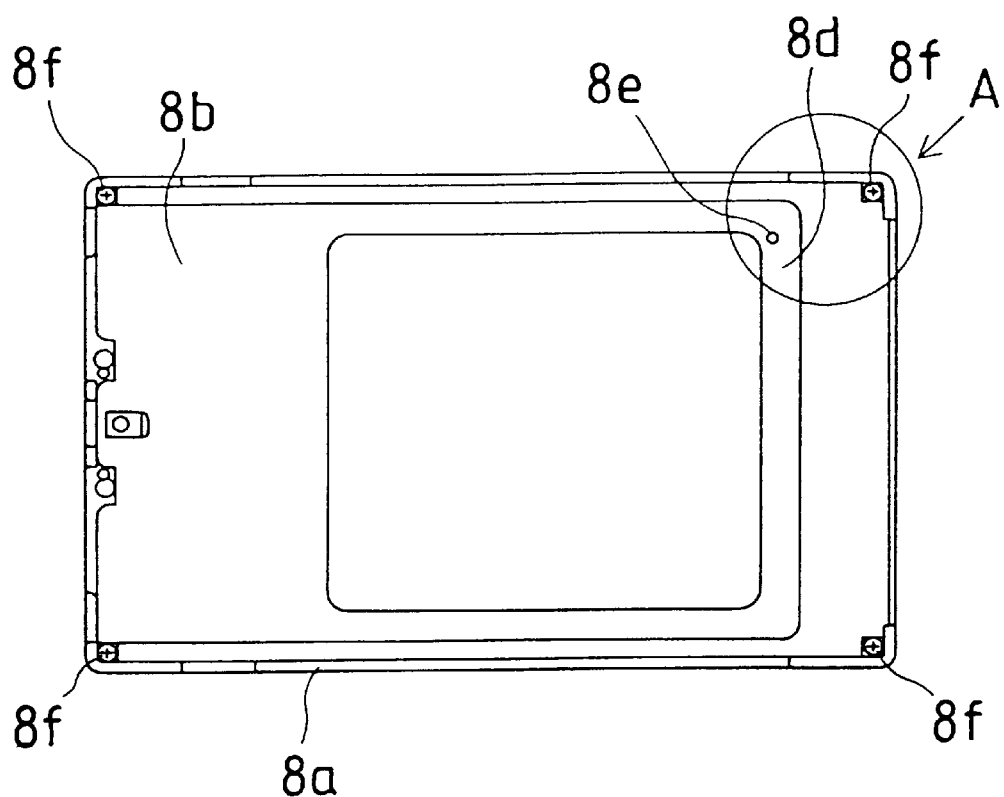
FIG. 2 is a view of the portable electronic equipment of FIG. 1 as seen from the back side.

As shown in FIG. 2, a peripheral portion of the lower cover 8b is subjected to drawing for enhancement of the strength of the lower cover 8b. The lower cover 8b has a small hole 8f, which allows the passage of a machine screw, in each of four corners. The lower cover 8b further has an operating through hole 8e, which is available for operating a third arm portion of a leaf spring member as will be described later, in the vicinity of a stepped portion formed by drawing.

Figure 7:
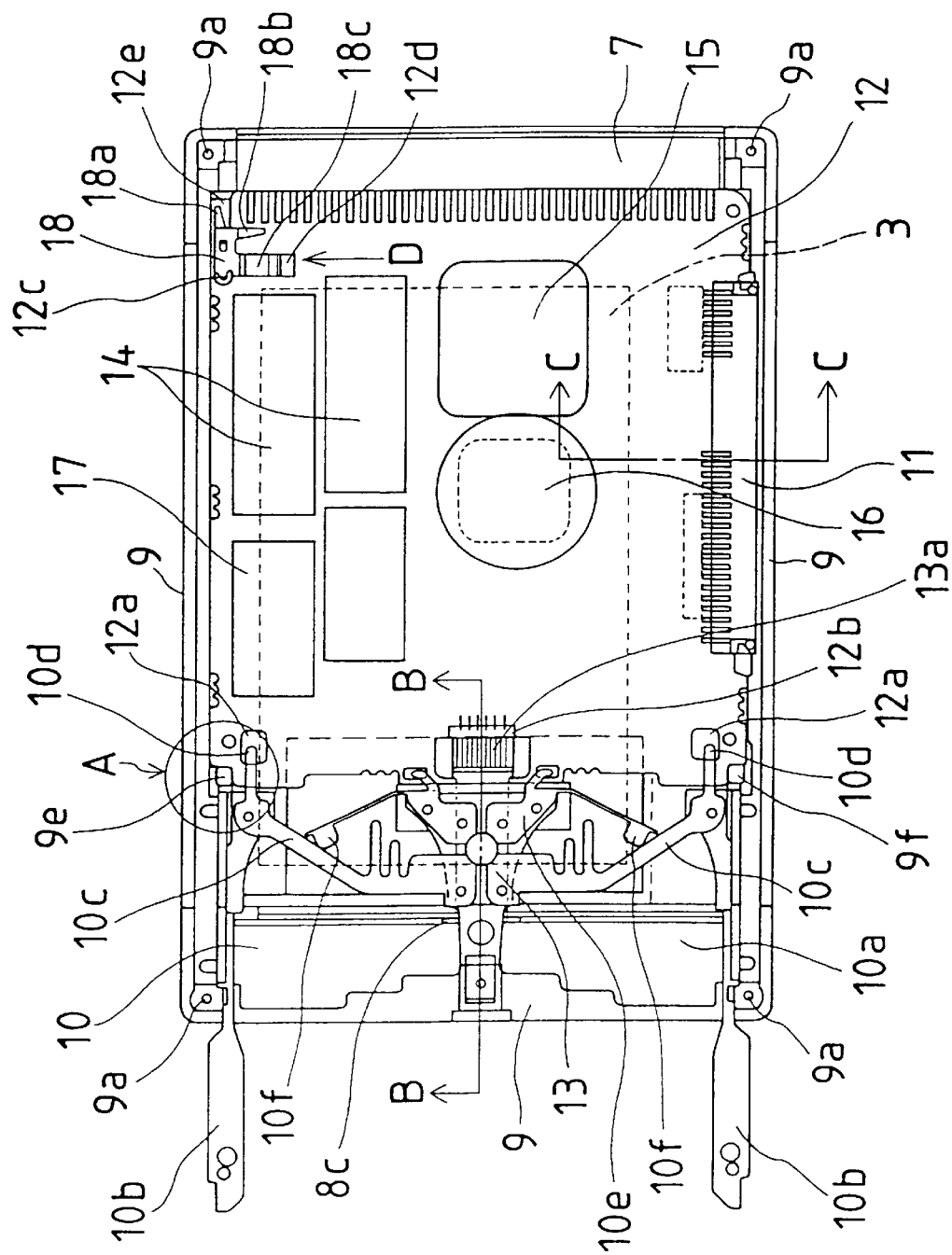
FIG. 7 is a view showing the state, in which a circuit substrate is placed on the liquid crystal cell of FIG. 5 one above the other and is provided with a battery holder, that is, the state of the portable electronic equipment of FIG. 1 where a lower cover is removed to look the inside through that place.

A frame 9 is arranged along the peripheral edges of the upper cover 8a and the lower cover 8b facing the upper cover 8a to define an inside space (i.e., a space to house the inside components including a circuit substrate, a liquid crystal cell and a battery holder, which will be described later). The frame 9 is formed by a plastic material and is bonded to the upper cover 8a after being outsert-molded to the upper cover 8a. Incidentally, it is to be understood that the frame 9 is not bonded to all over the four sides of the rectangular upper cover 8a, but it may be bonded to over the three sides excluding the side provided with the connector, as shown in FIG. 7.

The frame 9 has a screw hole 9a, which allows the insertion of a tip screw portion of the machine screw, at a position corresponding to each of the small holes 8f for the passage of the machine screws in the four corners of the lower cover 8b.

When the machine screw (not shown) is inserted into each of the small holes 8f for the passage of the machine screws in the four corners of the lower cover 8b to bring the tip screw portion of the machine screw into engagement with each of the screw holes 9a formed in the four corners of the frame 9 bonded to the upper cover 8a, the upper cover 8a, the lower cover 8b and the frame 9 are connected together into the assemblage of a case body of the portable electronic equipment 1.

Figure 4:
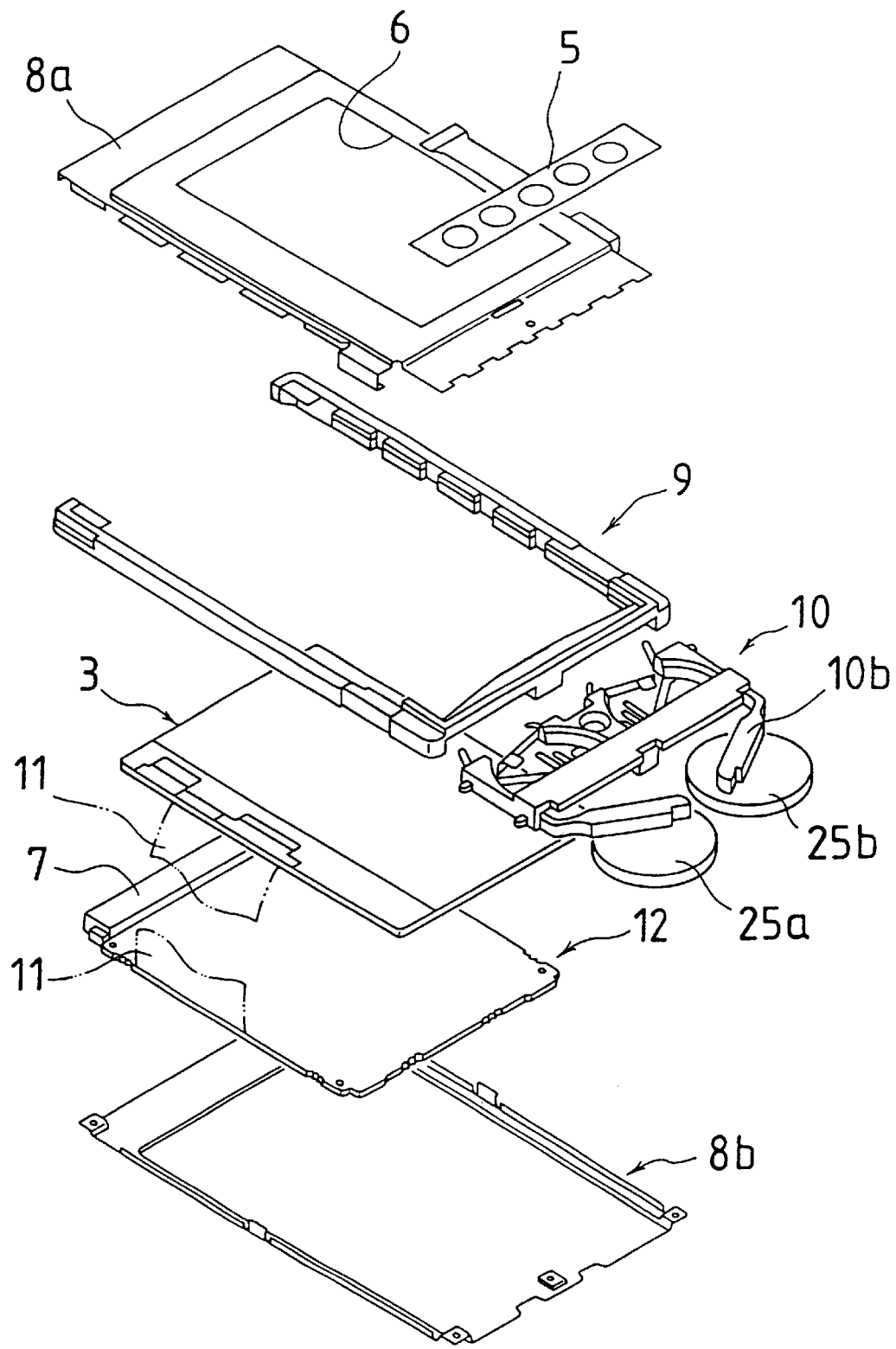
FIG. 4 is an exploded view showing the portable electronic equipment of FIG. 1.

As shown in the exploded view of FIG. 4, the inside components including the liquid crystal cell 3, the circuit substrate 12 and the battery holder 10 or the like are housed in the case body, resulting in the completion of the assemblage of the portable electronic equipment. Incidentally, the inside components including the liquid crystal cell 3, the circuit substrate 12 and the battery holder 10 or the like will be described later in detail.

The portable electronic equipment 1 has the battery holder (see FIG. 7) 10, which will be described later, at a portion corresponding to the position right beneath the operating member 5. This battery holder 10 contains two button-shaped batteries 25a, 25b and also enables the insertion or removal of these batteries 25a, 25b individually.

Figure 5:
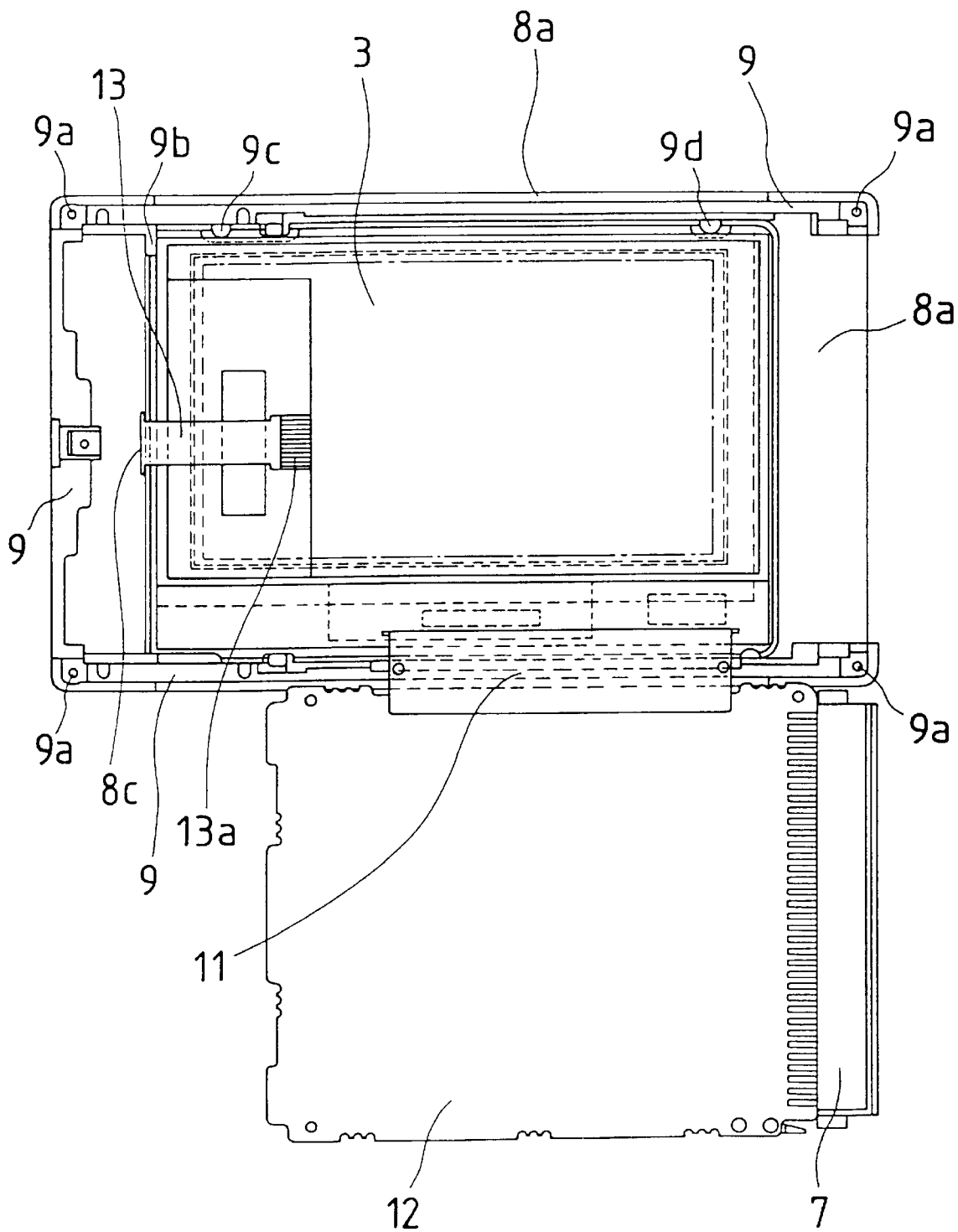
FIG. 5 is a plan view showing the state, in which a liquid crystal cell positioned on an upper cover is connected to a circuit substrate through a FPC.

FIG. 5 shows the state, in which the liquid crystal cell 3 positioned on the upper cover 8a is connected to the circuit substrate 12 through an FPC (flexible printed circuit) 11. One end of the FPC 11 is connected to one peripheral portion of the liquid crystal cell 3, while the other end of the FPC 11 is connected to one peripheral portion of the circuit substrate 12, so that the liquid crystal cell 3 and the circuit substrate 12 are connected together through the FPC 11.

Incidentally, the circuit substrate 12 shown in FIG. 5 is placed in the state of being unfolded from the liquid crystal cell 3 positioned on the upper cover 8a, while the pivotal motion (reversal) of the circuit substrate 12 about the FPC 11 causes the FPC 11 to be bent freely, and therefore, the circuit substrate 12 is changed to the state of being placed on the liquid crystal cell one above the other.

Further, the circuit substrate 12 has the connector 7 fitted to a peripheral portion adjoining to the peripheral portion, to which the FPC 11 is connected. The connector 7 sandwiches the peripheral portion of the circuit substrate 12 between a large number of signal terminals provided in two rows and is connected to the circuit substrate 12 by soldering.

Figure 6:
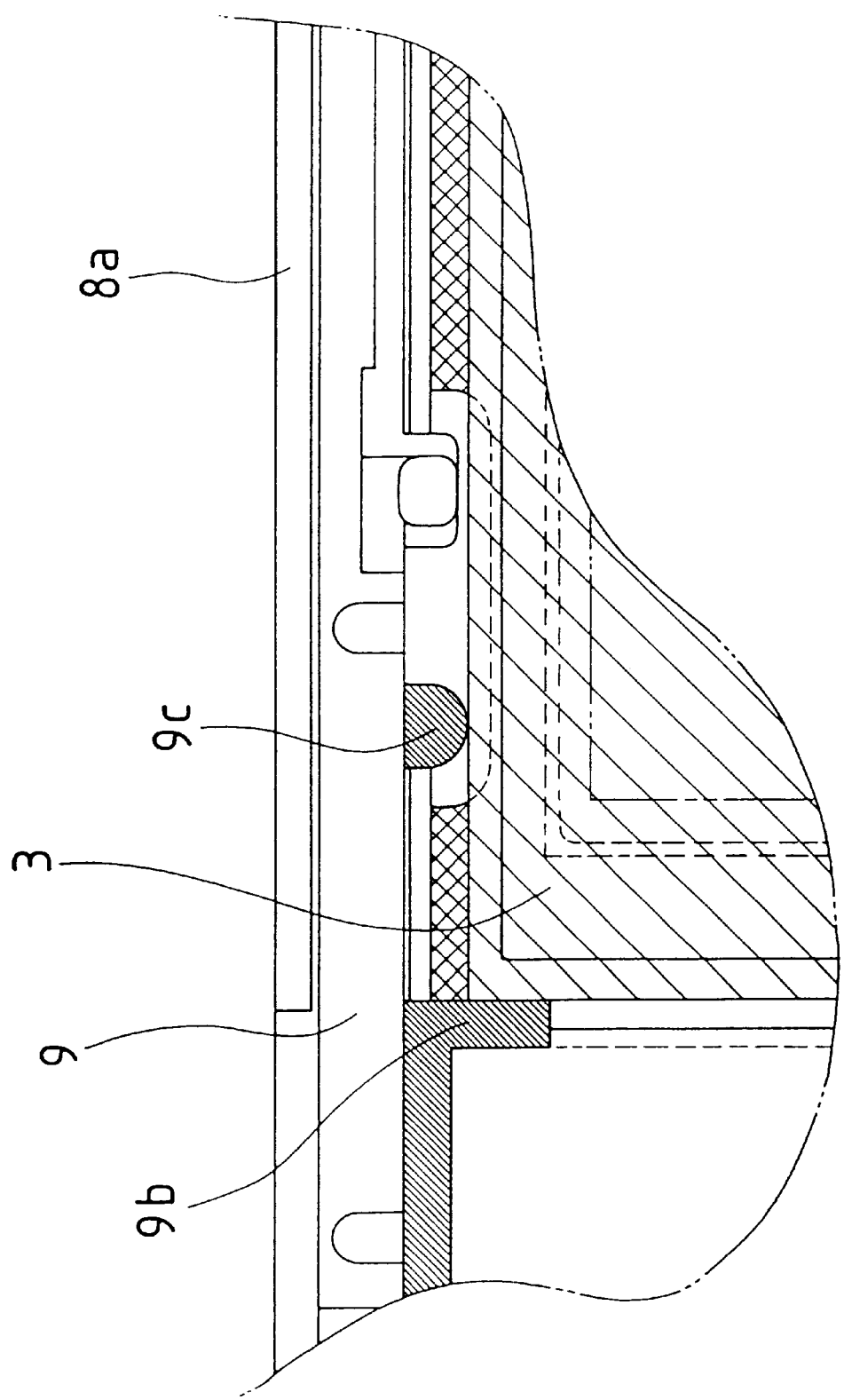
FIG. 6 is a fragmentary enlarged-scale view showing the state, in which the liquid crystal cell of FIG. 5 is positioned on a frame.

As shown in FIGS. 5 and 6, the frame 9 has positioning guides 9b, 9c and 9d of the inwardly projected shape on the inside surface of the side facing the side opposed to the FPC 11. The liquid crystal cell 3 is put into the space defined by the frame 9 bonded to the upper cover 8a in the manner of allowing one edge of the liquid crystal cell to be guided by these positioning guides 9b, 9c and 9d. Then, the liquid crystal cell 3 is bonded to the frame 9 with a fixing means such as a double coated tape.

The action of folding the FPC 11 causes the circuit substrate 12 to change from the state of being unfolded from the liquid crystal cell 3 as shown in FIG. 5 to the state of being folded over the liquid crystal cell 3, that is, the state, in which the liquid crystal cell (shown by a dotted line) and the circuit substrate 12 are placed one above the other as shown in FIG. 7. Then, the connector 7 is bonded to the back surface of the upper cover 8a with a fixing means such as a double coated tape.

Figure 10:
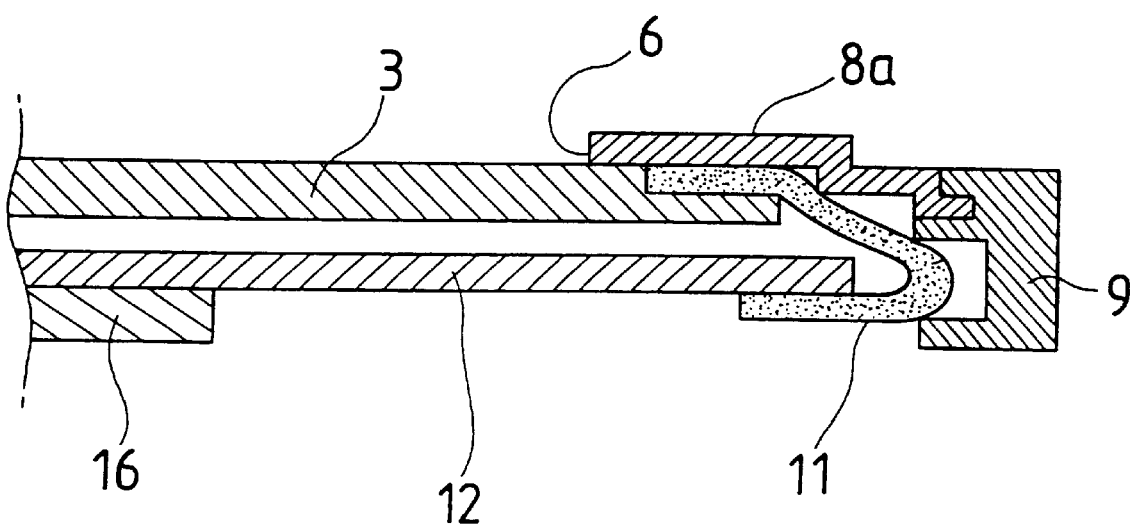
FIG. 10 is a sectional view taken on line C—C of FIG. 7.

When the circuit substrate 12 connected to the liquid crystal cell 3 through the FPC 11 is placed on the liquid crystal cell 3, which is positioned on the upper cover 8a, one above the other, the FPC 11 is bent in the U-like shape, and its bent portion is projected sideward. However, among the sides of the frame 9, the side opposed to the FPC 11 bent in the U-like shape is of concave structure in section, as shown in FIG. 10. Thus, since a part of the FPC bent in the U-like shape is housed in a concave portion of the frame 9, the edge of the liquid crystal cell and that of the circuit substrate 12 may be accordingly brought close to the frame 9, resulting in an increase of the circuit substrate and the display section in size.

Figure 8A:
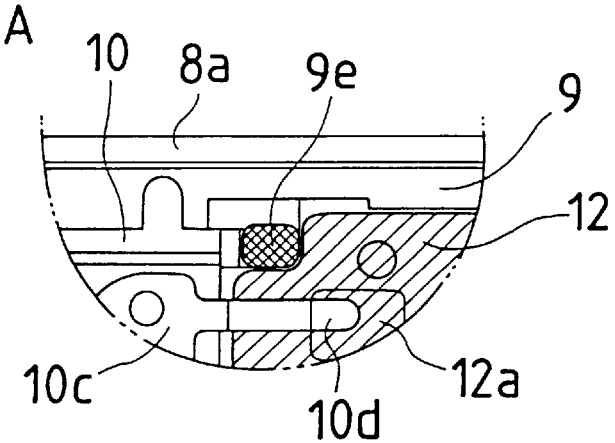
FIG. 8A is a fragmentary enlarged-scale view showing the state of a caulking pin shown in a portion A indicated by an arrow of FIG. 7 before being caulked.
Figure 8B:
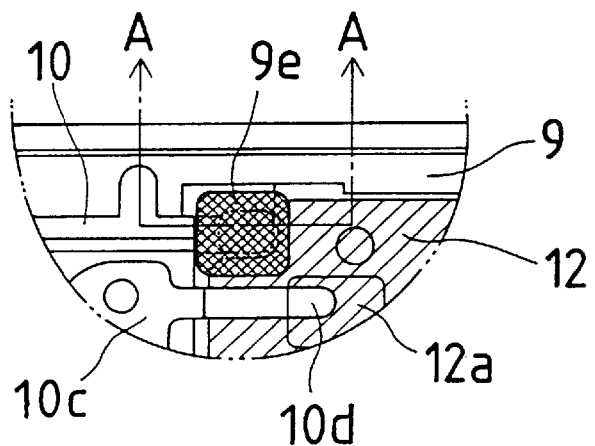
FIG. 8B is a fragmentary enlarged-scale view showing the state of the caulking pin of FIG. 8A after being caulked.
Figure 8C:
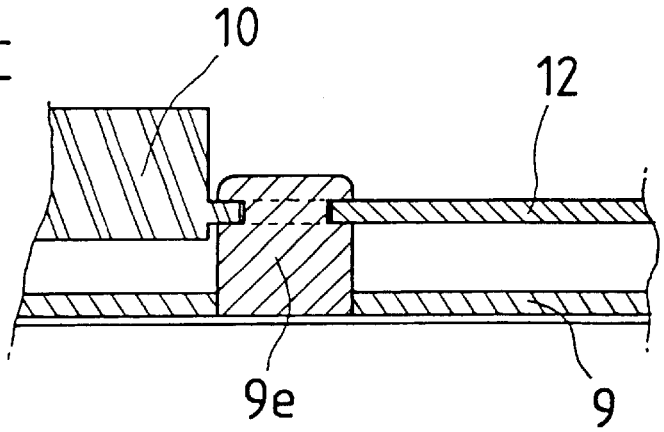
FIG. 8C is a sectional view taken on line A—A of FIG. 8B.

Further, the battery holder 10 is arranged on the opposite side to the connector 7 in the circuit substrate 12. In this case, the battery holder 10 and the circuit substrate 12 may be connected to the frame 9 simultaneously (see FIG. 8C) in the manner of aligning a caulking portion formed on the end of the battery holder 10 and a caulking portion of the circuit substrate 12 with a caulking pin 9e (and also a caulking pin 9f shown in FIG. 7) formed on the frame 9 united with the upper cover 8a after being outsert-molded thereto as shown in FIG. 8A and then thermally caulking the caulking pin 9e as shown in FIG. 8B.

As shown in FIG. 7, the battery holder 10 is composed of a resin-made battery frame 10a containing two button batteries 25a, 25b parallel to each other, two cover portions 10b united with the battery frame 10a and flexibly turned about their roots for the opening or closing motion in case of inserting or removing the batteries 25a, 25b, and two battery contact springs 10c, and minus-side ends 10d of the two battery contact springs 10c are respectively connected to the terminals 12a on the circuit substrate 12 by soldering. On the other hand, plus-side ends 10f of the two battery contact springs 10e are respectively energized to make contact with the side surfaces of the batteries 25a, 25b whenever these batteries are housed.

The circuit substrate 12 is mounted with a control device or the like composed of an SRAM 14 serving as a volatile memory for the storage of data, an IC 15 of a gate array containing a driver or the like for driving a display device for display, a CPU 16 for reading out the stored data from the volatile memory to display the read-out data on the display section 4 and a ROM 17.

Figure 9:
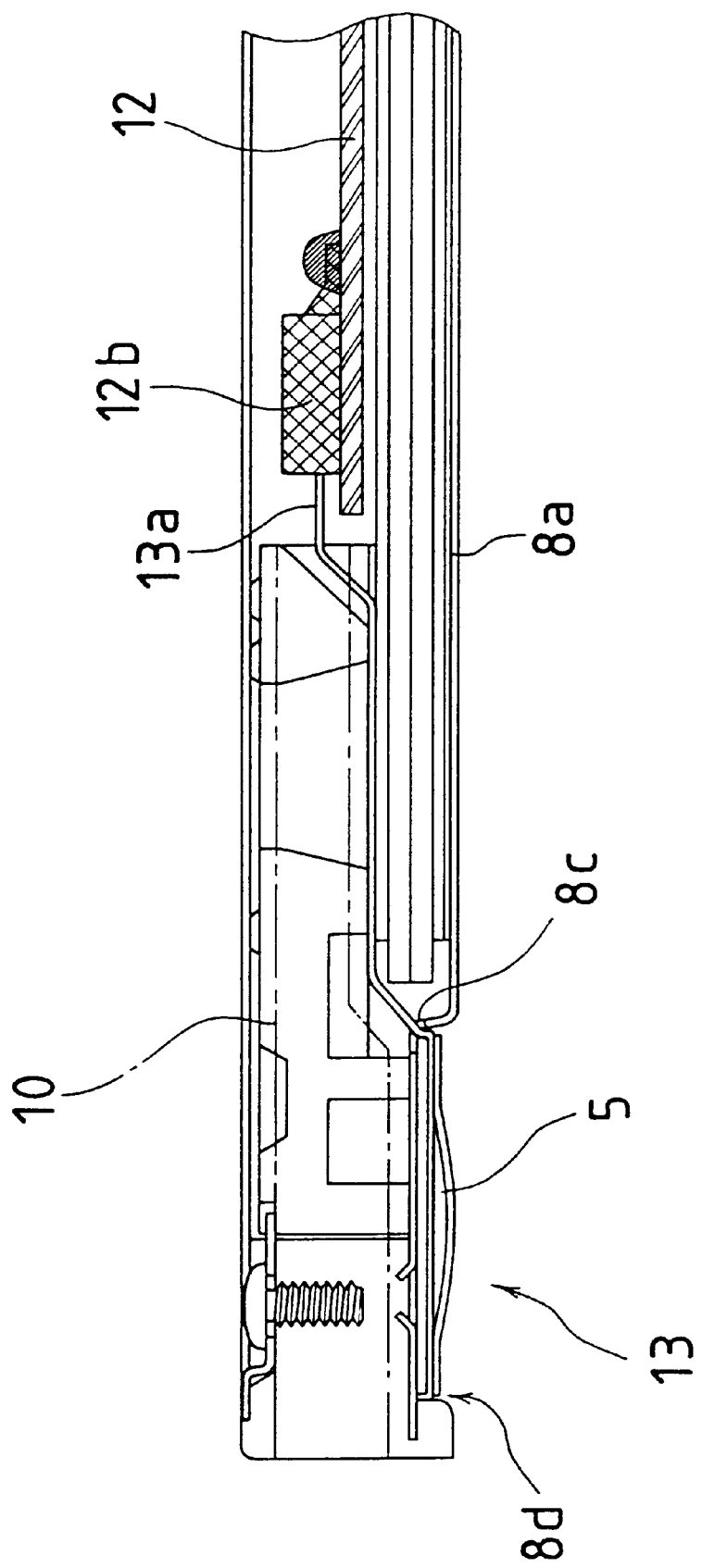
FIG. 9 is a sectional view taken on line B—B of FIG. 7.

As shown in FIG. 9, the operating member 5 composed of the keys 5a to 5e (see FIG. 1) is arranged on a portion above the housing portion of the battery holder 10 (shown by a chain line in FIG. 9) in the upper cover 8a formed by the metal thin plate. This operating member 5 is provided in the form of a switch block 13 having an inside connection wiring and holds a plurality of keys 5a to 5e in one block. This switch block 13 is fixed in position to the inside of a concave portion 8d provided on the upper cover 8a, and a FPC 13a of the switch block 13 is inserted into the connector 12b of the circuit substrate 12 through a connection hole 8c provided in a part of the upper cover 8a.

Then, as described above, the machine screw is inserted into each of the small holes 8f for the passage of the machine screws in the four corners of the lower cover 8b to bring the end screw portion of the machine screw into engagement with each of the screw holes 9a formed in the four corners of the frame body 9. Thereupon, the frame 9 is bonded to the upper cover 8a, and the liquid crystal cell is positioned on the upper cover 8a by the aid of the stepped portion 20, resulting in the completion of the assemblage of the portable electronic equipment 1 covered with the upper cover 8a, the lower cover 8b and the frame 9.

A description will now be given of a ground terminal of the circuit substrate 12.

As shown in FIG. 7, a ground (GND) terminal 12c is formed on a peripheral portion of the circuit substrate 12. A leaf spring member 18, which will be described later, is bonded to the ground terminal 12 by soldering.

Figure 11:
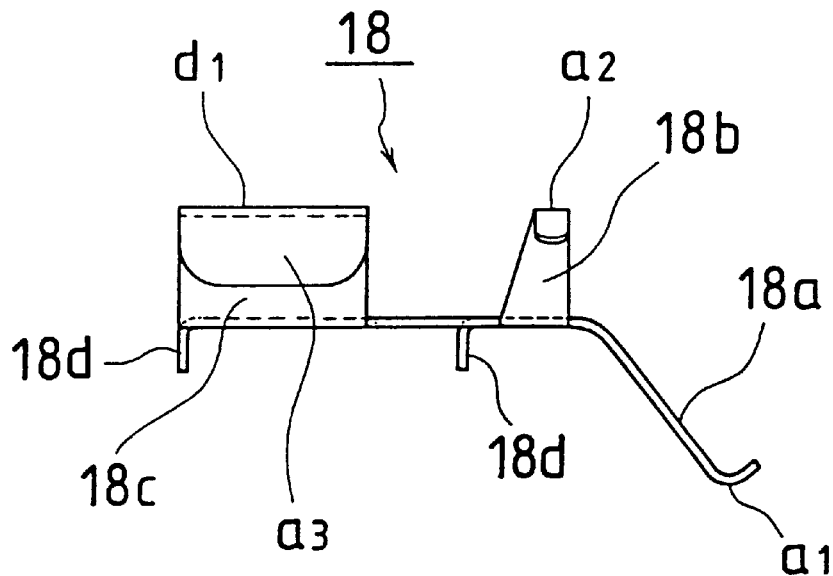
FIG. 11 is a view of a leaf spring member fixed in position to the circuit substrate of FIG. 7 as seen from a direction D of FIG. 7.
Figure 12:
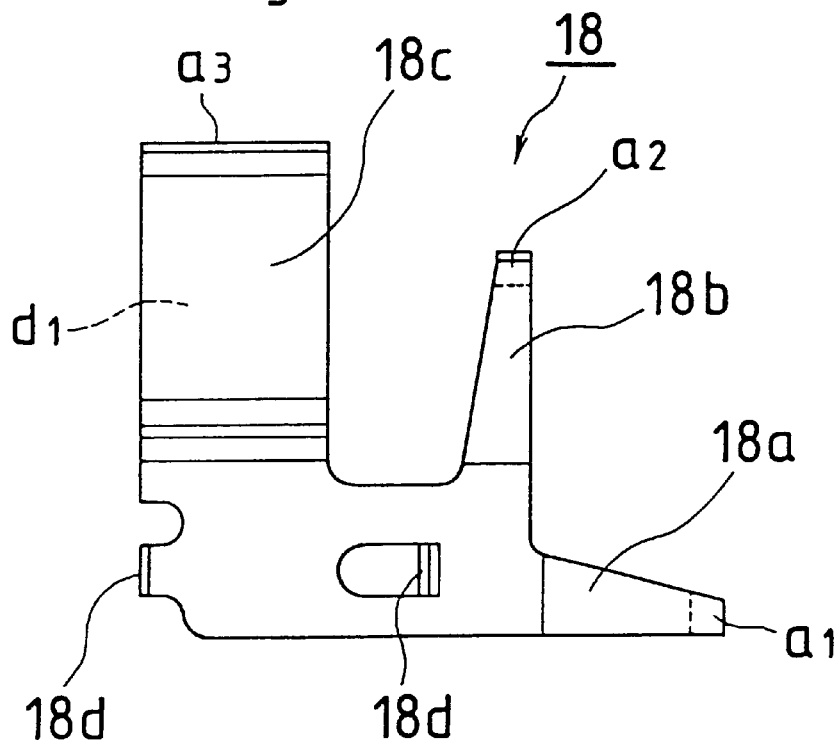
FIG. 12 is a bottom view showing the leaf spring member of FIG. 11.

Then, a description will now be given of the leaf spring member 18 with reference to FIGS. 11 and 12.

The leaf spring member 18 is formed by pressing a thin plate such as a SUS material and has a body portion integrally provided with a first arm portion 18a, a second arm portion 18b, a third arm portion 18c and two positioning portions 18d.

The first arm portion 18a has an end portion a1 bent to be capable of making contact with the upper cover 8a under pressure. The second arm portion 18b has an end portion a2 bent to be capable of making contact with the lower cover 8b under pressure. The third arm portion 18c has an end portion a3 bent to be capable of making contact with a switching pattern 12d (see FIG. 7, and its description will be given later) provided on the circuit substrate 12. Further, a press portion d1 corresponding to the operating through hole 8d (see FIG. 2) formed in the lower cover 8b is formed on the upper surface of the third arm portion 18c.

The first to third arm portions 18a, 18b and 18c of the leaf spring member 18 having spring properties. Further, the leaf spring member 18 is positioned on the circuit substrate 12 by the aid of the two positioning portions 18d.

Figure 13:
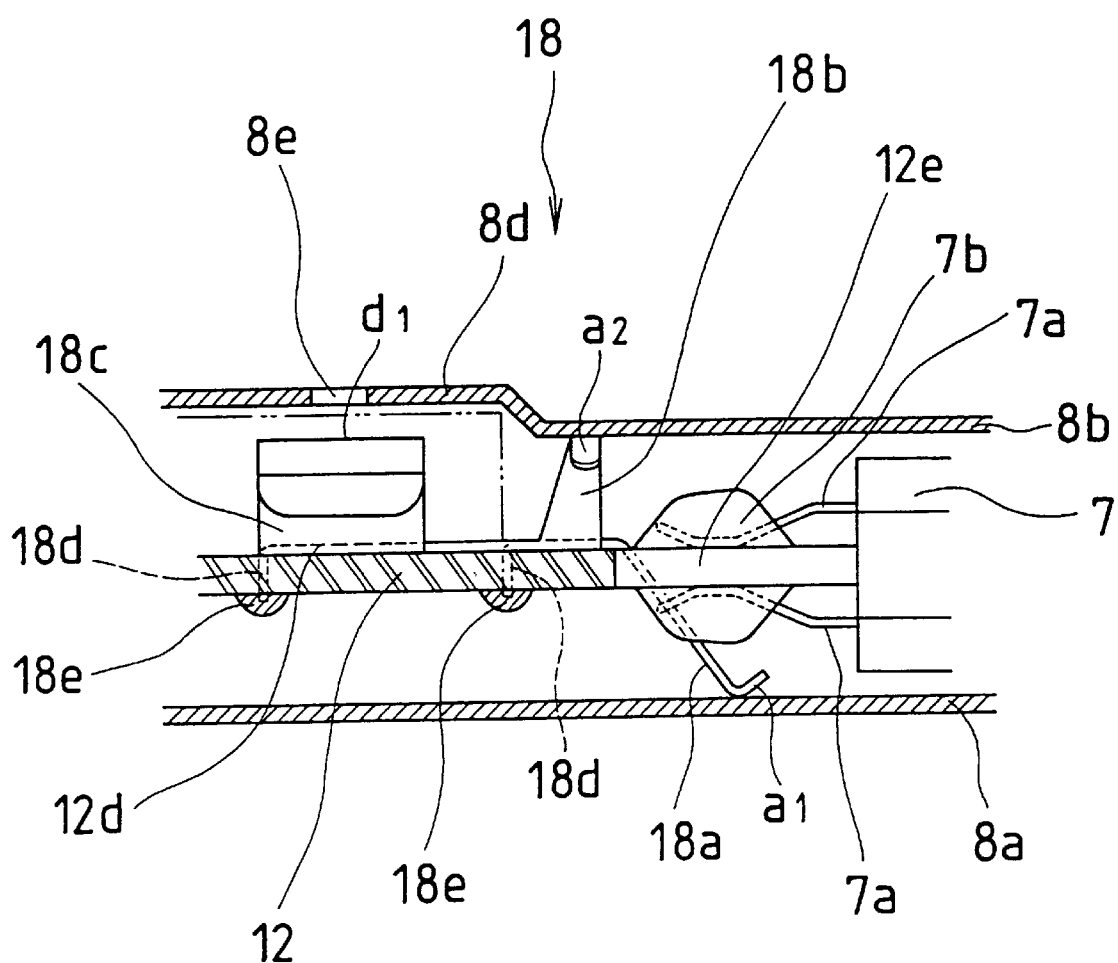
FIG. 13 is a view for explaining the state, in which the leaf spring member of FIG. 11 is fixed in position to the circuit substrate.

As shown in FIG. 13, the leaf spring member 18 is positioned on the circuit substrate in the manner of inserting each positioning portion 18d of the leaf spring member 18 into the ground terminal 12c (see FIG. 7) of the circuit substrate 12. Then, the end of each positioning portion 18d and the ground terminal 12c are connected together by soldering. A reference numeral 18e in FIG. 13 denotes a soldered portion.

After having passed through an opening portion 12e formed by notching in the peripheral portion of the circuit substrate 12, the end portion a1 of the first arm portion 18a makes contact with the inner wall surface of the upper cover 8a and then passes the inner wall surface of the upper cover 8a by making use of the spring property of the first arm portion 18a. At the same time, the second arm portion 18b makes contact with the inner wall surface of the lower cover 8b and presses the inner surface of the lower cover 8b by making use of the spring property.

As described above, the circumference of the lower cover 8b is subjected to drawing for enhancement of the strength of the lower cover 8b. As shown in FIG. 13, the operating through hole 8e for operating the third arm portion 18c of the leaf spring member 18 is formed in the vicinity of the stepped portion of a portion 8d formed by drawing.

Figure 14:
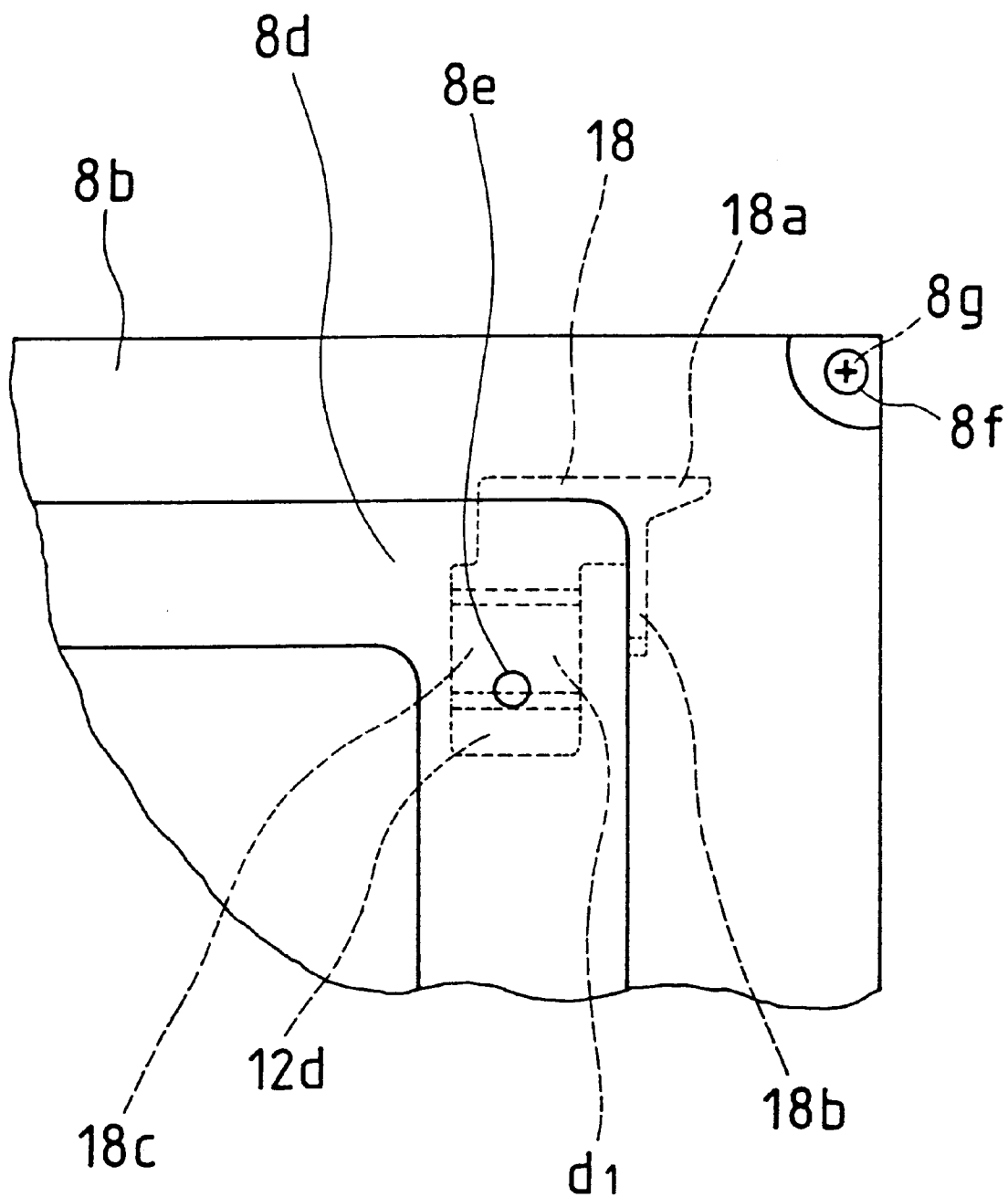
FIG. 14 is a fragmentary enlarged-scale view showing a portion A indicated by an arrow of FIG. 2, together with the positional relation between the leaf spring member of FIG. 11 and an operating through hole formed in a lower cover.
Figure 15:
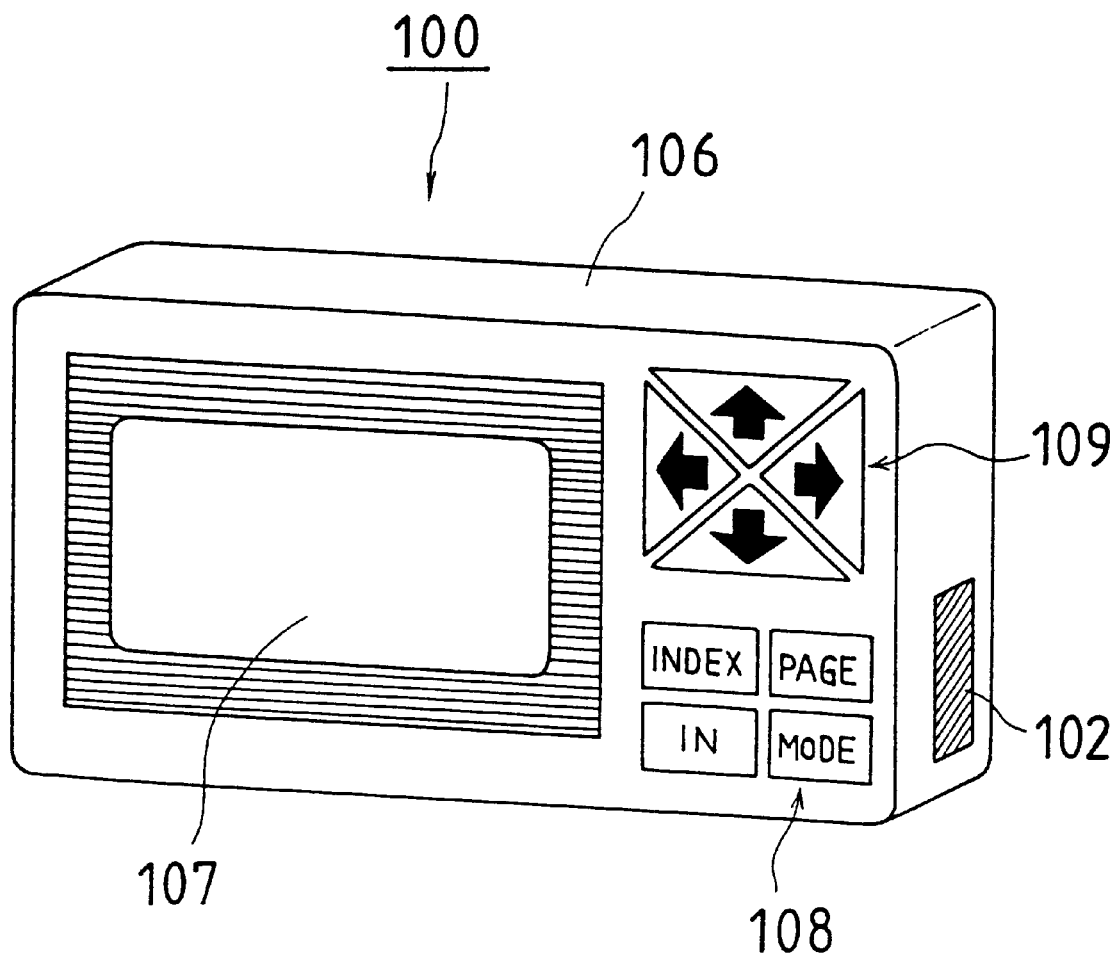
FIG. 15 is a perspective view showing the external appearance of a portable electronic equipment in the prior art.
Figure 16:
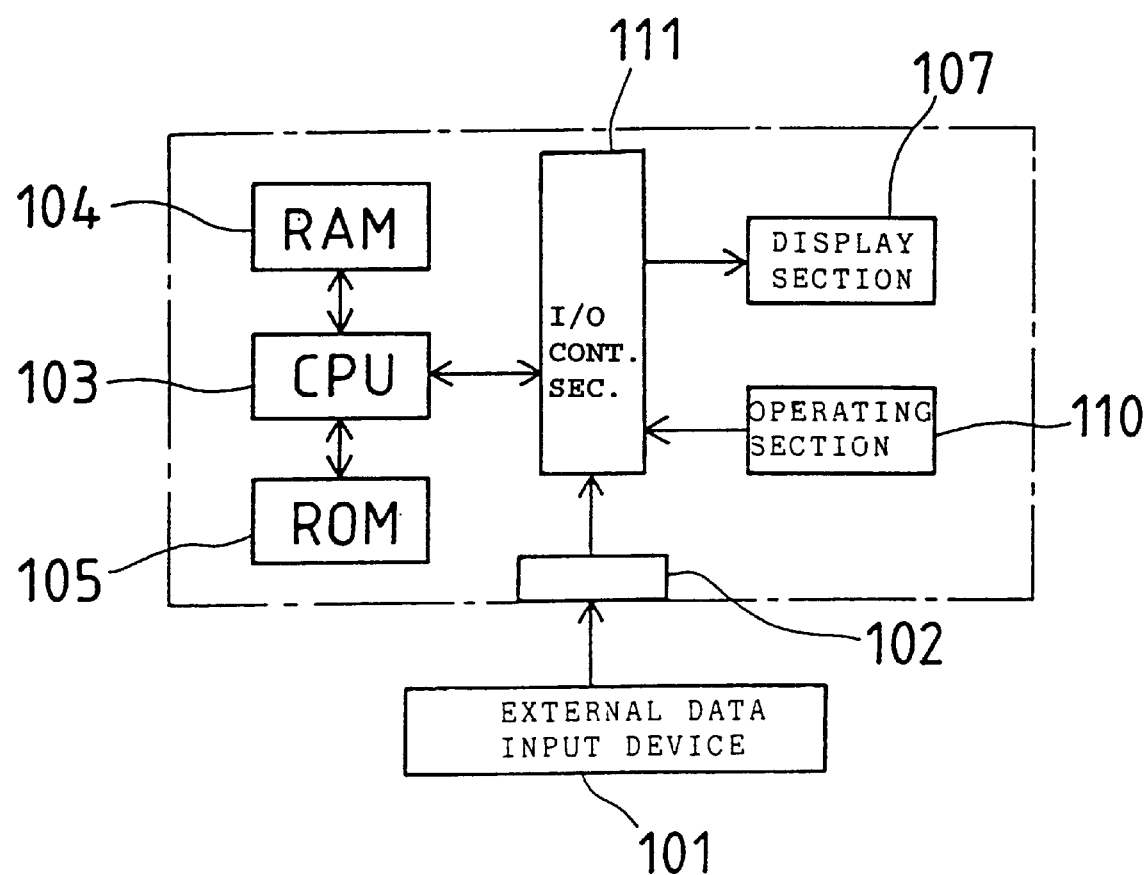
FIG. 16 is a block diagram showing the configuration of a control section of the portable electronic equipment of FIG. 15.
Figure 17:
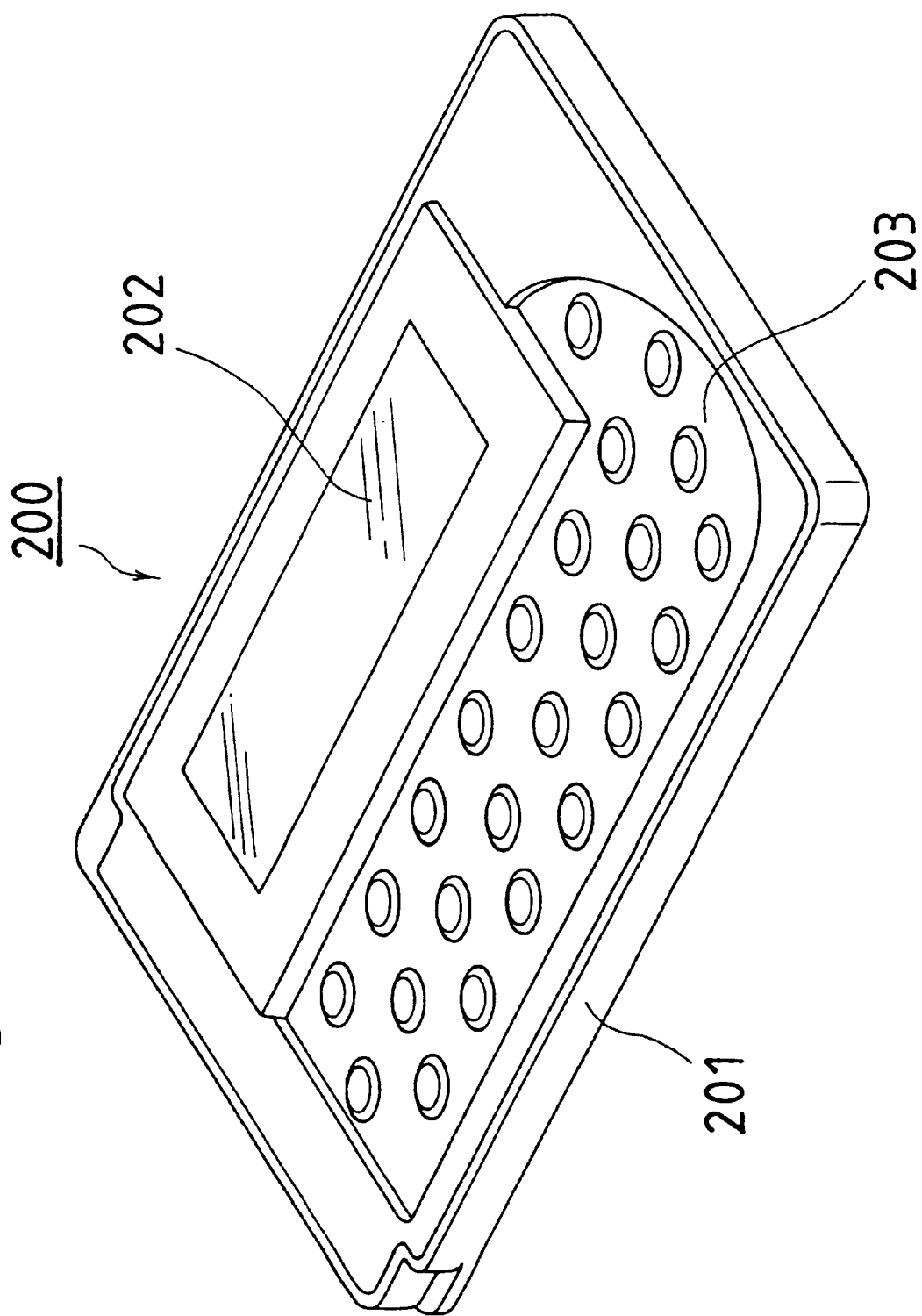
FIG. 17 is a perspective view showing the external appearance of a portable electronic equipment in the prior art of a different type.
Figure 18:
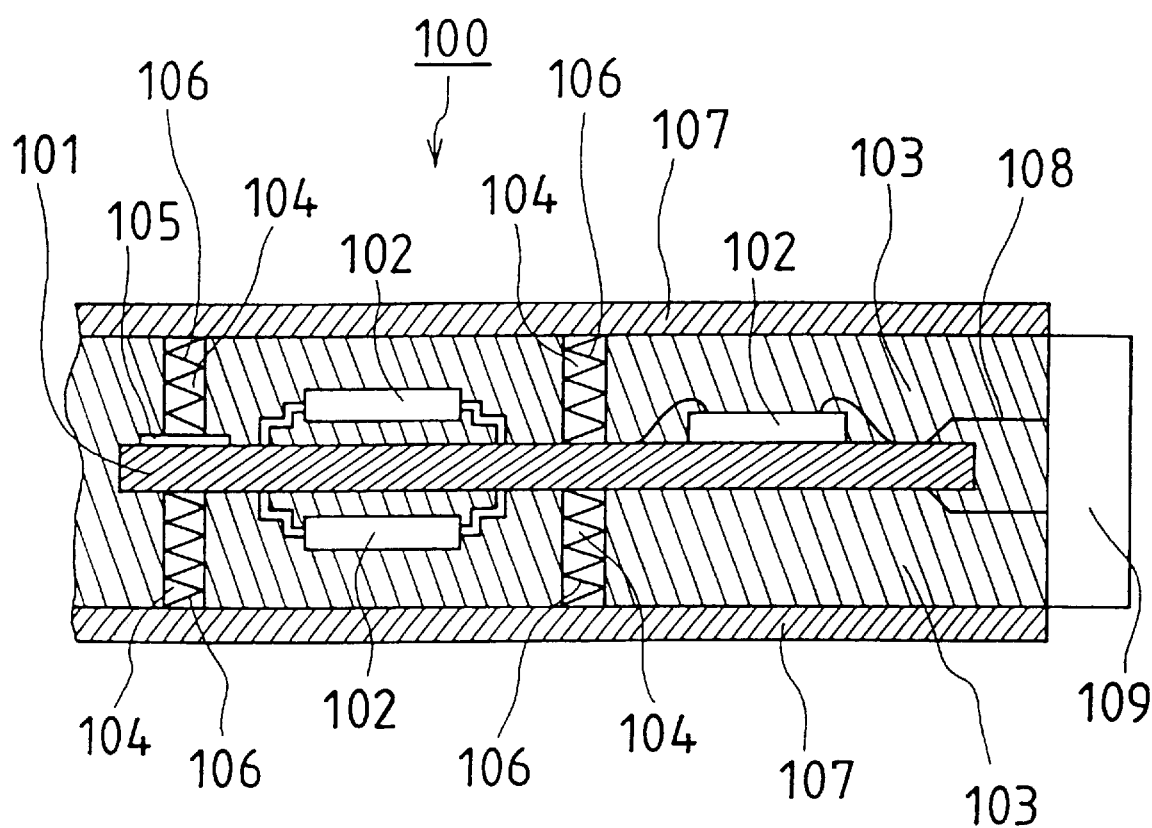
FIG. 18 is a fragmentary sectional view showing the inside structure of a portable electronic equipment in the prior art of a further different type.

FIG. 14 shows the positional relation between the operating through hole 8e formed in the lower cover 8b and the leaf spring member 18. In FIG. 14, the position of the leaf spring member 18 is shown by a dashed line. Referring to FIG. 14, it is understood that the press portion a3 of the third arm portion 18c may be seen through the operating through hole 8e.

As described above, since the operating through hole 8e is formed in the vicinity of the stepped portion of the portion 8d formed by drawing and therefore, shows high strength, any deformation of the lower cover 8b does not occur easily even if an unexpected external force is applied to a portion of this operating through hole, and the lower cover never presses the press portion d of the third arm portion 18c.

When each positioning portion 18d of the leaf spring member 18 is inserted into the ground terminal 12c of the circuit substrate 12, while the first arm portion 18a of the leaf spring member 18 is placed in the state of pressing the inner wall surface of the upper cover 8a, and the second arm portion is placed in the state of pressing the inner wall surface of the lower cover 8b, the electrical connection is made between the upper and lower covers 8a, 8b and the circuit substrate 12, and as a result, the upper and lower covers 8a, 8b are grounded.

Further, the third arm portion 18c is operated from the outside through the operating through hole 8e formed in the lower cover 8b to thereby bring the third arm portion 18c into contact with the switching pattern 12d, and therefore, it is possible to put a reset function to work.

As described above, the portable electronic equipment according to the present invention is equivalent to a PC card having a size equal to a credit card size and based on PCMCIA standard type. The connector is united with the circuit substrate, and the liquid crystal cell is further united with the circuit substrate through the FPC. This portable electronic equipment is of arrangement structure, in which the liquid crystal cell is mounted in the case body after being positioned therein, the FPC is folded to place the circuit substrate on the bottom surface of the liquid crystal cell one above the other, the battery holder is provided on one end of the circuit substrate, and the connector is provided on the other end thereof. Thus, it becomes possible to provide the portable electronic equipment which may be mounted with a large integrated circuit to enable expansion of a processing function in the limited space, while enabling display of more information content on one image screen by enlarging an area of the display within the area of the body to the maximum.

Further, the portable electronic equipment in the present invention is simple in structure, since it mounts one leaf spring member having at least three arm portions on the peripheral portion of the circuit substrate such that two arm portions make electrical connection between the cover members to be grounded and the circuit substrate and serve as a magnetic shield to make it possible to remove a disturbance component provided from the outside and also to discharge the electric charge from the circuit substrate. Further, it becomes possible to provide the portable electronic equipment having a structure of the leaf spring member formed by a less-expensive and multifunctional united member, in which the other arm portion exerts a reset function by bringing the other arm portion into contact with the switch pattern on the circuit substrate through the operation of the operating through hole with a pin or the like.

What is claimed is:

1. A portable electronic equipment, comprising:
a case body composed of an upper cover having a display window, a lower cover arranged at a position facing said upper cover and a frame arranged along the peripheral edges of said upper cover and said lower cover to define an inside space; and
inside components housed in said inside space of said case body and including a circuit substrate, a liquid crystal cell of a size to substantially cover said circuit substrate, and a battery holder for holding button-shaped batteries;
wherein a connector including a large number of signal terminals is bonded to one side end of said circuit substrate, and said connector has a length substantially equal to the width of said one side end of the circuit substrate; and
said battery holder is arranged on the side of said circuit substrate opposite to the connector, while said liquid crystal cell is arranged on an upper surface side of said circuit substrate to substantially cover said circuit substrate.

2. A portable electronic equipment according to claim 1, wherein said upper cover and said lower cover are formed by a metal thin plate, and said frame is made of a resin.

3. A portable electronic equipment according to claim 1, wherein said liquid crystal cell is connected to the circuit substrate through a flexible printed circuit (FPC).

4. A portable electronic equipment according to claim 1, wherein one end of said FPC is bonded to one peripheral portion of the liquid crystal cell, while the other end thereof is connected to a peripheral portion of said circuit substrate correspondingly to said peripheral portion of said liquid crystal cell, and said FPC is bent between the liquid crystal cell and the circuit substrate placed one above the other in said case body.

5. A portable electronic equipment according to claims 4, wherein said frame has a concave portion for housing a bent portion of said FPC.

6. A portable electronic equipment comprising:
a case body composed of an upper cover having a display window, a lower cover arranged at a position facing said upper cover and a frame arranged along the peripheral edges of said upper cover and said lower cover to define an inside space; and
inside components housed in said inside space of said case body and including a circuit substrate, a liquid crystal cell of a size to substantially cover said circuit substrate, and a battery holder for holding button-shaped batteries, wherein
a connector including a large number of signal terminals is bonded to one side end of said circuit substrate;
said battery holder is arranged on the side of said circuit substrate opposite to the connector, while said liquid crystal cell is arranged on an upper surface side of said circuit substrate to substantially cover said circuit substrate; and
an operating member is arranged in said upper cover at a portion above the battery holder housed in said case body.

7. A portable electronic equipment according to claim 6, wherein said operating member includes a switch block having an inside connection wiring, and this switch block is fixed to said upper cover, while said inside connection wiring is connected to the circuit substrate through a connection hole formed in a part of the upper cover.

8. A portable electronic equipment according to claim 7, wherein said upper cover has a concave portion for positioning said switch block.

9. A portable electronic equipment according to claim 7, wherein said upper cover has a connection hole in the vicinity of a portion provided with the switch block, and the wiring of said switch block is connected to said circuit substrate through the FPC passing through said connection hole.

10. A portable electronic equipment, comprising:
a case body composed of an upper cover having a display window, a lower cover arranged at a position facing said upper cover and a frame arranged along the peripheral edges of said upper cover and said lower cover to define an inside space; and
inside components housed in said inside space of said case body and including a circuit substrate, a liquid crystal cell of a size to substantially cover said circuit substrate, and a battery holder for holding button-shaped batteries, wherein
a connector including a large number of signal terminals is bonded to one side end of said circuit substrate;
said battery holder is arranged on the side of said circuit substrate opposite to the connector, while said liquid crystal cell is arranged on an upper surface side of said circuit substrate to substantially cover said circuit substrate; and
said battery holder has a resin-made battery frame and a battery connection spring, and said battery frame is fixed to the frame of said case body, while said battery connection spring is electrically connected to a terminal on said circuit substrate.

11. A portable electronic equipment, comprising:
a case body composed of an upper cover having a display window, a lower cover arranged at a position facing said upper cover and a frame arranged along the peripheral edges of said upper cover and said lower cover to define an inside space and
inside components housed in said inside space of said case body and including a circuit substrate, a liquid crystal cell of a size to substantially cover said circuit substrate, and a battery holder for holding button-shaped batteries, wherein
a connector including a large number of signal terminals is bonded to one side end of said circuit substrate;
said battery holder is arranged on the side of said circuit substrate opposite to the connector, while said liquid crystal cell is arranged on an upper surface side of said circuit substrate to substantially cover said circuit substrate;
said upper cover and said lower cover are formed by a metal thin plate, and said frame is made of a resin; and
said frame has a caulking pin projected from a portion corresponding to said inside components, while said inside components have a hole or a concave portion brought into engagement with said caulking pin for fixing said inside components to said frame by caulking the caulking pin after inserting or fitting said caulking pin into the hole or to the concave portion of said inside components.

12. A portable electronic equipment according to claim 11, wherein at least two of said inside components within said fame are simultaneously fixed to said frame by caulking.

13. A portable electronic equipment according to claim 12, wherein at least said two inside components include the circuit substrate and the battery holder.

14. A portable electronic equipment, comprising:

a case body composed of an upper cover having a display window, a lower cover arranged at a position facing said upper cover and a frame arranged along the peripheral edges of said upper cover and said lower cover to define an inside space; and inside components housed in said inside space of said case body and including a circuit substrate, a liquid crystal cell of a size to substantially cover said circuit substrate, and a battery holder for holding button-shaped batteries, wherein a connector including a large number of signal terminals is bonded to one side end of said circuit substrate;

said battery holder is arranged on the side of said circuit substrate opposite to the connector, while said liquid crystal cell is arranged on an upper surface side of said circuit substrate to substantially cover said circuit substrate;

said upper cover and said lower cover are formed by a metal thin plate, and said frame is made of a resin; and said circuit substrate has a ground terminal and a switch pattern and is mounted with a leaf spring member including a first arm portion, a second arm portion and a third arm portion, the leaf spring member itself is electrically connected to the ground terminal, the first arm portion is bent to be capable of making contact with said upper cover under pressure, the second arm portion is bent to be capable of making contact with said lower cover under pressure, and the third arm portion is bent to be capable of making contact with said switch portion.

15. A portable electronic equipment according to claim 14, wherein said upper or lower cover has an operating through hole, which is available for operating the third arm portion, at a position corresponding to said third arm portion.

16. A portable electronic equipment according to claim 14, wherein the end of said first or second arm portion is brought into contact with the upper or lower cover under pressure after having passed through an opening portion formed in said circuit substrate.

17. A portable electronic equipment according to claim 16, wherein said leaf spring member is mounted on the peripheral portion of said circuit substrate.

18. A portable electronic equipment according to claim 15, wherein one cover having said operating through hole out of the upper and lower covers has a portion formed by drawing, and the operating through hole of said third arm portion is provided in the vicinity of the stepped portion of said portion formed by drawing.

19. A portable electronic equipment, comprising:

a case body;

a circuit substrate;

a liquid crystal cell of a size to substantially cover said circuit substrate; and a battery holding member for holding two button-shaped batteries in parallel, said circuit substrate, said liquid crystal cell and said battery holding member being housed in an inside space of said case body, wherein a connector including a large number of signal terminals is connected to one side end of said circuit substrate such that an end of said connector is exposed to the outside through one side end of said case body;

said battery holding member is arranged on the side of the circuit substrate opposite said connector;

an other end of said body casing defines a battery insertion port for mounting the two button-shaped batteries on said battery holding member or for taking out of said button-shaped batteries therefrom;

said liquid crystal cell is arranged on an upper surface side of said circuit substrate to cover said circuit substrate; and a plurality of operation input keys are arranged in a row in a peripheral portion close to the battery insertion port on the front surface of said case body.

20. A portable electronic equipment, comprising:

a case body;

a circuit substrate;

a liquid crystal cell of a size to substantially cover said circuit substrate; and a battery holding member for holding two button-shaped batteries in parallel, said circuit substrate, said liquid crystal cell and said battery holding member being housed in an inside space of said case body, wherein a connector including a large number of signal terminals is connected to one side end of said circuit substrate such that an end of said connector is exposed to the outside through one side end of said case body;

said battery holding member is arranged on the side of the circuit substrate opposite said connector;

an other end of said body casing defines a battery insertion port for mounting the two button-shaped batteries on said battery holding member or for taking out of said button-shaped batteries therefrom;

said liquid crystal cell is arranged on an upper surface side of said circuit substrate to cover said circuit substrate; and said battery holding member has a frame containing two batteries individually and a pair of movable covers for closing said battery insertion port, said frame and said covers being formed as one body.

21. A portable electronic equipment, comprising:

a case body composed of an upper cover having a display window, a lower cover arranged at a position facing said upper cover and a frame arranged along the peripheral edges of said upper cover and said lower cover to define an inside space; and inside components housed in said inside space of said case body and including a circuit substrate, a liquid crystal cell of a size to substantially cover said circuit substrate, and a battery holder for holding button-shaped batteries, wherein a connector including a large number of signal terminals is bonded to one side end of said circuit substrate;

said battery holder is arranged on the side of said circuit substrate opposite to the connector, while said liquid crystal cell is arranged on an upper surface side of said circuit substrate to substantially cover said circuit substrate; and said liquid crystal cell arranged on said upper surface side of said circuit substrate partly protrudes from said circuit substrate and is placed on at least a part of said battery holder, which is arranged on the other side of said circuit substrate, one above the other.

22. A portable electronic equipment according to claim 1, wherein said battery holder is to hold two button-shaped batteries in parallel.

23. A portable electronic equipment, comprising:

a case body composed of an upper cover having a display window, a lower cover arranged at a position facing said upper cover and a frame arranged along the peripheral edges of said upper cover and said lower cover to define an inside space; and inside components housed in said inside space of said case body and including a circuit substrate, a liquid crystal cell of a size to substantially cover said circuit substrate, and a battery holder for holding button-shaped batteries, wherein a connector including a large number of signal terminals is bonded to one side end of said circuit substrate;

said battery holder is arranged on the side of said circuit substrate opposite to the connector, while said liquid crystal cell is arranged on an upper surface side of said circuit substrate to substantially cover said circuit substrate;

said battery holder is to hold two button-shaped batteries in parallel; and said battery holder is formed to be substantially equal in width to said circuit substrate.

24. A portable electronic equipment according to claim 13, wherein said circuit substrate and said battery holder are fixed by caulking to each other at both ends facing each other.

25. A portable electronic equipment comprising:
a case body;
a circuit substrate;
a liquid crystal cell of a size to substantially cover said circuit substrate; and
a battery holding member for holding two button-shaped batteries in parallel, said circuit substrate, said liquid crystal cell and said battery holding member being housed in an inside space of said case body;
wherein a connector including a large number of signal terminals is connected to one side end of said circuit substrate such that an end of said connector is exposed to the outside through one side end of said case body, and said connector has a length substantially equal to the width of said one side end of the circuit substrate;
said battery holding member is arranged on the side of the circuit substrate opposite said connector;
an other end of said body casing defines a battery insertion port for mounting the two button-shaped batteries on said battery holding member or for taking out of said button-shaped batteries therefrom; and
said liquid crystal cell is arranged on an upper surface side of said circuit substrate to cover said circuit substrate.

26. A portable electronic equipment, comprising:
a case body;
a circuit substrate;
a liquid crystal cell of a size to substantially cover said circuit substrate; and
a battery holding member for holding two button-shaped batteries in parallel, said circuit substrate, said liquid crystal cell and said battery holding member being housed in an inside space of said case body, wherein
a connector including a large number of signal terminals is connected to one side end of said circuit substrate such that an end of said connector is exposed to the outside through one side end of said case body;
said battery holding member is arranged on the side of the circuit substrate opposite said connector;
an other end of said body casing defines a battery insertion port for mounting the two button-shaped batteries on said battery holding member or for taking out of said button-shaped batteries therefrom;
said liquid crystal cell is arranged on an upper surface side of said circuit substrate to cover said circuit substrate; and said battery holder is formed to be substantially equal in width to said circuit substrate.

27. A portable electronic equipment according to claim 1, wherein said liquid crystal cell has a two dimensional figure substantially similar to that of said circuit substrate.

28. A portable electronic equipment, comprising:
a case body composed of an upper cover having a display window, a lower cover arranged at a position facing said upper cover and a frame arranged along the peripheral edges of said upper cover and said lower cover to define an inside space; and
inside components housed in said inside space of said case body and including a circuit substrate, a liquid crystal cell of a size to substantially cover said circuit substrate, and a battery holder for holding button-shaped batteries, wherein
a connector including a large number of signal terminals is bonded to one side end of said circuit substrate;
said battery holder is arranged on the side of said circuit substrate opposite to the connector, while said liquid crystal cell is arranged on an upper surface side of said circuit substrate to substantially cover said circuit substrate; and
said upper cover has a stepped portion in its peripheral portion for positioning said liquid crystal cell.

29. A portable electronic equipment, comprising:
a case body composed of an upper cover having a display window, a lower cover arranged at a position facing said upper cover and a frame arranged along the peripheral edges of said upper cover and said lower cover to define an inside space; and
inside components housed in said inside space of said case body and including a circuit substrate, a liquid crystal cell of a size to substantially cover said circuit substrate, and a battery holder for holding button-shaped batteries, wherein
a connector including a large number of signal terminals is bonded to one side end of said circuit substrate;
said battery holder is arranged on the side of said circuit substrate opposite to the connector, while said liquid crystal cell is arranged on an upper surface side of said circuit substrate to substantially cover said circuit substrate; and
said frame has positioning guides for positioning said liquid crystal cell.

30. A portable electronic equipment, comprising:
a case body composed of an upper cover having a display window, a lower cover arranged at a position facing said upper cover and a frame arranged along the peripheral edges of said upper cover and said lower cover to define an inside space; and
inside components housed in said inside space of said case body and including a circuit substrate, a liquid crystal cell of a size to substantially cover said circuit substrate, and a battery holder for holding button-shaped batteries, wherein
said circuit substrate and said battery holder are fixed to said frame of said case body;
said battery holder is arranged on one side of said circuit substrate;
a connector, having signal terminals, is bonded to a peripheral portion of said circuit substrate on a side opposite said battery holder; and
said liquid crystal cell is arranged on an upper surface side of said circuit substrate to substantially cover said circuit substrate.

* * * * *

UNITED STATES PATENT AND TRADEMARK OFFICE
CERTIFICATE OF CORRECTION

PATENT NO. : 6,392,881 B1
DATED : May 21, 2002
INVENTOR(S) : Asao Saitoh

It is certified that error appears in the above-identified patent and that said Letters Patent is hereby corrected as shown below:

Column 12,
Lines 1-4 and 27-30, should read as follows:
    an other end of said case body defines a battery insertion port for mounting the two button-shaped batteries on said battery holding member or for taking out of said button-shaped batteries therefrom;

Column 13,
Lines 40-43, should read as follows:
    an other end of said case body defines a battery insertion port for mounting the two button-shaped batteries on said battery holding member or for taking out of said button-shaped batteries therefrom; and
Lines 61-64, should read as follows:
    an other end of said case body defines a battery insertion port for mounting the two button-shaped batteries on said battery holding member or for taking out of said button-shaped batteries therefrom;

Signed and Sealed this

First Day of April, 2003

JAMES E. ROGAN
*Director of the United States Patent and Trademark Office*